United States Patent
Cheng

(10) Patent No.: US 10,278,297 B1
(45) Date of Patent: Apr. 30, 2019

(54) CASE WITH ASSEMBLY STRUCTURE AND ELECTRONIC DEVICE USING THEREOF

(71) Applicant: GETAC TECHNOLOGY CORPORATION, Hsinchu County (TW)

(72) Inventor: Yao-Kun Cheng, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/730,671

(22) Filed: Oct. 11, 2017

(51) Int. Cl.
*H05K 5/02* (2006.01)
*H05K 5/03* (2006.01)
*H01M 2/10* (2006.01)
*H05K 5/00* (2006.01)

(52) U.S. Cl.
CPC ........ *H05K 5/0221* (2013.01); *H01M 2/1022* (2013.01); *H05K 5/0086* (2013.01); *H05K 5/0091* (2013.01); *H05K 5/03* (2013.01)

(58) Field of Classification Search
CPC .. H05K 5/0221; H05K 5/0086; H05K 5/0091; H05K 5/03; H01M 2/1022
See application file for complete search history.

(56) References Cited

U.S. PATENT DOCUMENTS

| | | | | |
|---|---|---|---|---|
| 5,649,750 A * | 7/1997 | Ishii | ...................... | G06F 1/1616 292/219 |
| 6,251,535 B1 * | 6/2001 | Yamada | .............. | H01M 2/1022 429/100 |
| 6,302,454 B1 * | 10/2001 | Tsurumaru | .......... | H01M 2/1022 292/145 |
| 6,409,042 B1 * | 6/2002 | Hirano | ................ | H01M 2/1022 220/812 |
| 7,790,309 B2 * | 9/2010 | Okachi | ............... | H01M 2/1022 429/129 |
| 8,709,633 B2 * | 4/2014 | Yamasaki | ........... | H01M 2/1066 429/100 |
| 9,972,812 B1 * | 5/2018 | Motoyama | .............. | H01M 2/30 |
| 10,050,455 B2 * | 8/2018 | Hsu | ........................ | H02J 7/0044 |
| 2004/0038121 A1 * | 2/2004 | Song | .................... | H01M 2/1022 429/97 |
| 2006/0088377 A1 * | 4/2006 | Rejman | ..................... | B25F 5/02 403/331 |
| 2007/0241721 A1 * | 10/2007 | Weinstein | ........... | H01M 2/1022 320/114 |

(Continued)

*Primary Examiner* — Binh B Tran
*Assistant Examiner* — Douglas R Burtner

(57) ABSTRACT

A case with assembly structure includes a body, an engaging portion, a fixing element and an elastic element. The body has an accommodating slot and the engaging portion is disposed in the accommodating slot. The fixing element is slidably disposed on the main body and is located on one side of the accommodation slot and adjacent to the engaging portion. The fixing element has a hook. One end of the elastic element is disposed to the body and another end is disposed to the fixing element. The fixing element is moved between a fixed position and a release position along a first direction. When the fixing element is moved to the release position, the hook of the fixing element is moved along a second direction to hook the engaging portion. Meanwhile, the elastic element is made the fixing element be pulled toward the fixed position.

14 Claims, 5 Drawing Sheets

(56) References Cited

U.S. PATENT DOCUMENTS

| | | | |
|---|---|---|---|
| 2007/0270194 A1* | 11/2007 | Park | H04M 1/0262 455/575.1 |
| 2007/0287035 A1* | 12/2007 | Marmaropoulos | H01M 2/1005 429/122 |
| 2008/0025010 A1* | 1/2008 | Zick | H01M 2/1022 361/807 |
| 2011/0157861 A1* | 6/2011 | Takaiwa | G06F 1/1635 361/837 |
| 2012/0039025 A1* | 2/2012 | Chen | H01M 2/1022 361/679.01 |
| 2012/0039031 A1* | 2/2012 | Miyagi | E05C 1/00 361/679.01 |
| 2012/0170182 A1* | 7/2012 | Liu | E05C 1/14 361/679.01 |
| 2012/0307451 A1* | 12/2012 | Shukla | G06F 1/1658 361/699 |
| 2014/0105682 A1* | 4/2014 | Chen | F16B 1/00 403/376 |
| 2015/0146351 A1* | 5/2015 | Minaguchi | G06F 1/1616 361/679.01 |
| 2015/0339568 A1* | 11/2015 | Nekoogar | G06K 19/07798 235/492 |
| 2016/0306389 A1* | 10/2016 | Urimoto | G06F 1/1656 |
| 2017/0181299 A1* | 6/2017 | Shi | H04M 1/0262 |
| 2018/0175551 A1* | 6/2018 | Yamachika | H01R 12/72 |

* cited by examiner

CASE WITH ASSEMBLY STRUCTURE AND ELECTRONIC DEVICE USING THEREOF

BACKGROUND OF THE INVENTION

Field of the Invention

The present invention relates to assembly structures and electronic devices using the same and, more particularly, to a case with an assembly structure and an electronic device using the same, characterized in that a battery is automatically fastened in place after being mounted on the electronic device.

Description of the Prior Art

A typical, conventional portable electronic device often comes with a battery in order to be operating anywhere conveniently. The battery is demountable and thus replaceable whenever it runs out of power and a charging source is unavailable. The demountable battery may be mounted on the electronic device by two conventional techniques: first, mounting the battery on the electronic device and then covering it with a lid to prevent its detachment; second, mounting and fastening the battery onto the electronic device with an engagement structure thereof.

The second technique further requires a user to pull a fixing element by hand in order for the mounted battery to be fastened and fixed in place. Alternatively, a spring structure disposed in the electronic device enables the battery to be automatically fastened and fixed in place when mounted on the electronic device and thus dispenses with the need for the aforesaid manual operation.

SUMMARY OF THE INVENTION

The aforesaid technique of pulling a fixing element by hand has a drawback: if a user forgets to fasten a battery in place after mounting the battery on an electronic device, the battery is likely to loosen and fall off, thereby ending up in damage.

The aforesaid spring structure cannot work without the user's fixing the fixing element at a locked position and then pushing the fixing element as soon as the battery is mounted in place, thereby allowing the fixing element to return to the locked position under a restoring force of a spring. Although the aforesaid spring structure precludes the situation where the user forgets to fasten the battery in place, it brings inconvenience to the user, because the user has to keep pushing the fixing element while demounting the battery.

In view of this, the present invention in an embodiment thereof provides a case with an assembly structure. The case comprises a body, an engaging portion, a fixing element and an elastic component. The body has a receiving slot. The engaging portion is disposed in the receiving slot. The fixing element is disposed on the body slidably, beside the receiving slot, and proximate to the engaging portion. The fixing element has a hook. The elastic component has one end disposed at the body and the other end disposed at the fixing element. The fixing element moves in a first direction to a locked position and a released position. If the fixing element moves to the released position, the hook of the fixing element moves in a second direction perpendicular to the first direction to become engaged with the engaging portion, and the elastic component drives the fixing element toward the locked position.

The present invention in another embodiment thereof provides an electronic device. The electronic device comprises a case and a battery pack. The case comprises a body, an engaging portion, a fixing element, and an elastic component. The body has a receiving slot. The engaging portion is disposed in the receiving slot. The fixing element is disposed on the body slidably, beside the receiving slot, and proximate to the engaging portion. The fixing element has a hook. The elastic component has one end disposed at the body and the other end disposed at the fixing element. The battery pack comprises a pushing element. The fixing element moves in the first direction to a locked position and a released position. If the fixing element moves to the released position, the hook of the fixing element moves in a second direction perpendicular to the first direction to become engaged with the engaging portion, and the elastic component drives the fixing element toward the locked position, wherein positioning the fixing element at the released position and inserting the battery pack into the receiving slot together causes the pushing element to push the protruding element so that the hook separates from the engaging portion, and the elastic component causes the fixing element to move to the locked position.

Given the aforesaid assembly structure, when the battery pack is to be removed or is not mounted on the case, the fixing element is moved to the released position and fixed at the released position without any chance of going back to the locked position. Therefore, the user can demount the battery pack without pushing the fixing element continuously.

The elastic component provides an acting force under which the fixing element is driven toward the locked position continuously. As soon as the battery pack is received in the receiving slot, the hook of the fixing element separates from the engaging portion, and the elastic component causes the fixing element to move to the locked position, thereby causing the fixing element to automatically fasten the battery pack in place. Therefore, the user need not pull the fixing element by hand in order to move it to the locked position. Accordingly, the situation where the user forgets to fasten the battery pack after mounting the battery pack in place and in consequence the battery pack loosens, falls off and gets damaged is impossible to occur.

In some embodiments, the case further comprises a lid and an operating element. The lid is fastened to the body. The lid has a guide hole. The operating element is mounted on the fixing element and slides within the guide hole. The operating element enables the user to move the fixing element from the locked position to the released position easily. The guide hole ensures that the operating element slides within a specific range of distances.

In some embodiments, to preclude the situation where the user carrying or operating the electronic device inadvertently triggers the operating element to move to the released position after the fixing element has slid and moved to the locked position under the acting force exerted by the elastic component, the guide hole has a positioning portion, and the operating element slides and moves in the second direction to reach the positioning portion.

In some embodiments, the operating element comprises at least one raised portion, and the fixing element further comprises at least one raised track. The at least one raised portion slides and moves in the second direction to any one side of the at least one raised track selectively. Therefore, when the operating element is to move to the positioning portion, the at least one raised portion and the at least one raised track operate jointly to give the user a sense of operating the operating element and thus assure the user that the operating element has been positioned in place. Furthermore, the raised tracks serve a positioning purpose to prevent the operating element from moving slidingly out of the positioning portion.

In some embodiments, the fixing element further comprises at least one positioning element, and the at least one positioning element protrudes in the second direction. The battery pack further comprises at least one blocking element so that if the fixing element moves to the locked position and the battery pack is received in the receiving slot, the at least one positioning element blocks the at least one blocking element, respectively. Therefore, if the battery pack is received in the receiving slot and the fixing element has moved to the locked position, the at least one positioning element blocks the battery pack and prevents the battery pack from loosening.

In some embodiments, the at least one positioning element comprises a ramp. If the fixing element is not fixed to the released position, it is not necessary to move the fixing element to the released position beforehand in order to mount the battery pack on the case. What the user needs to do is to press the battery pack into the receiving slot and allow the blocking elements to push the fixing element along the ramps so that the fixing element moves toward the released position, thereby allowing the battery pack to be received in the receiving slot. After the battery pack has been mounted on the case, the fixing element moves to the locked position under the restoring force of the elastic component. Therefore, the process performed by the user to mount and fasten the battery pack to the case according to the present invention is simpler than its conventional counterpart.

The features and advantages of the present invention are detailed hereinafter with reference to the preferred embodiments. The detailed description is intended to enable persons skilled in the art to gain insight into the technical contents disclosed herein and implement the present invention accordingly. In particular, persons skilled in the art can easily understand the objectives and advantages of the present invention by referring to the disclosure of the specification, the claims, and the accompanying drawings.

DETAILED DESCRIPTION OF THE EMBODIMENTS

The technical solutions proposed herein to achieve the objectives of the present invention are further described below with reference to accompanying drawings and preferred embodiments of the present invention. Persons skilled in the art understand that directional wording, including "above" and "downward," used in describing the preferred embodiments of the present invention is illustrative of directions in the accompanying drawings rather than restrictive of the present invention. Moreover, persons skilled in the art may make numerous variations and changes in the preferred embodiments of the present invention without departing from the spirit and scope of the present invention, and the resultant preferred embodiments of the present invention must be deemed falling within the scope of the present invention.

Figure 1:
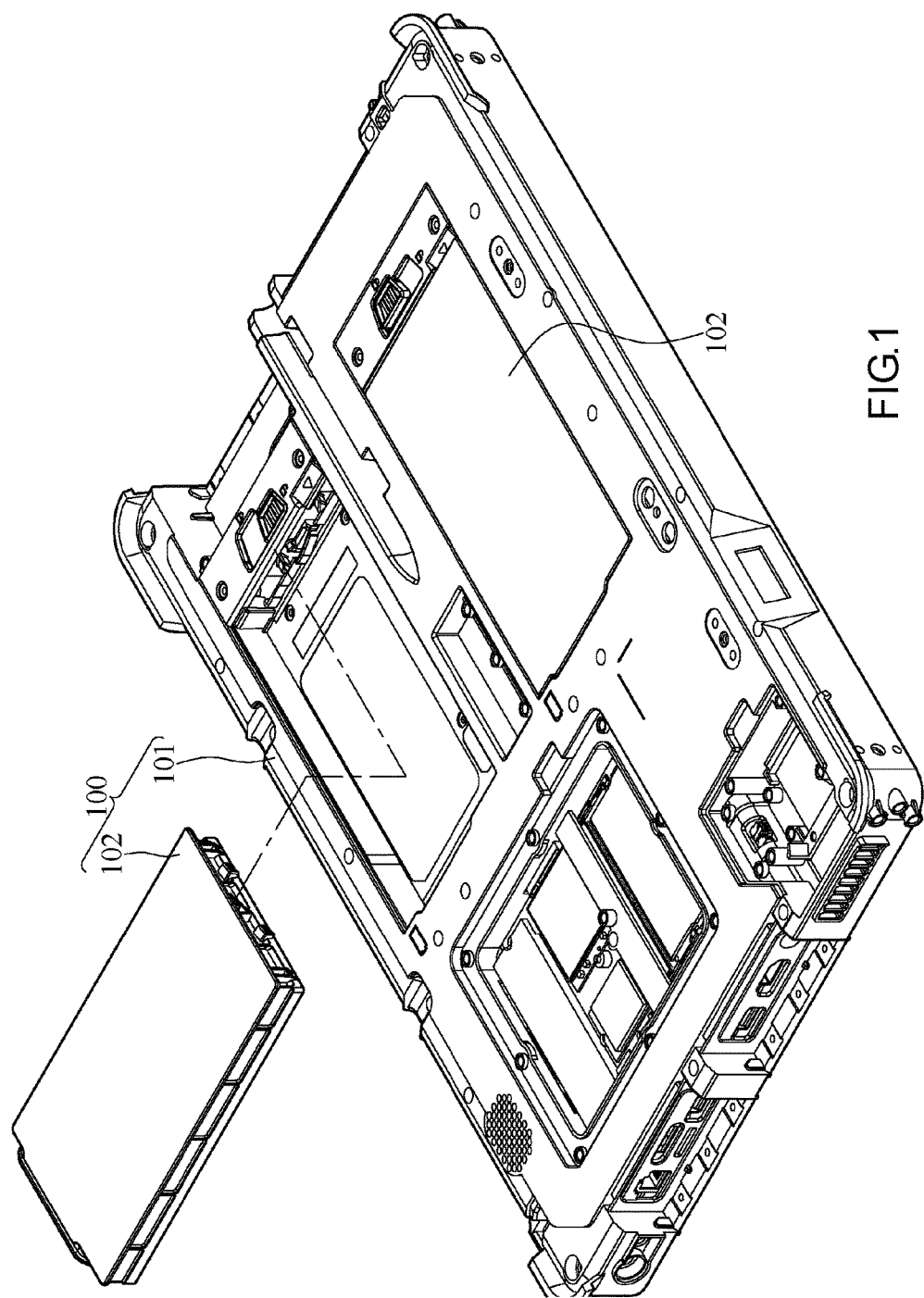
FIG. 1 is a schematic view of assembly of an electronic device according to the first embodiment of the present invention.
Figure 2:
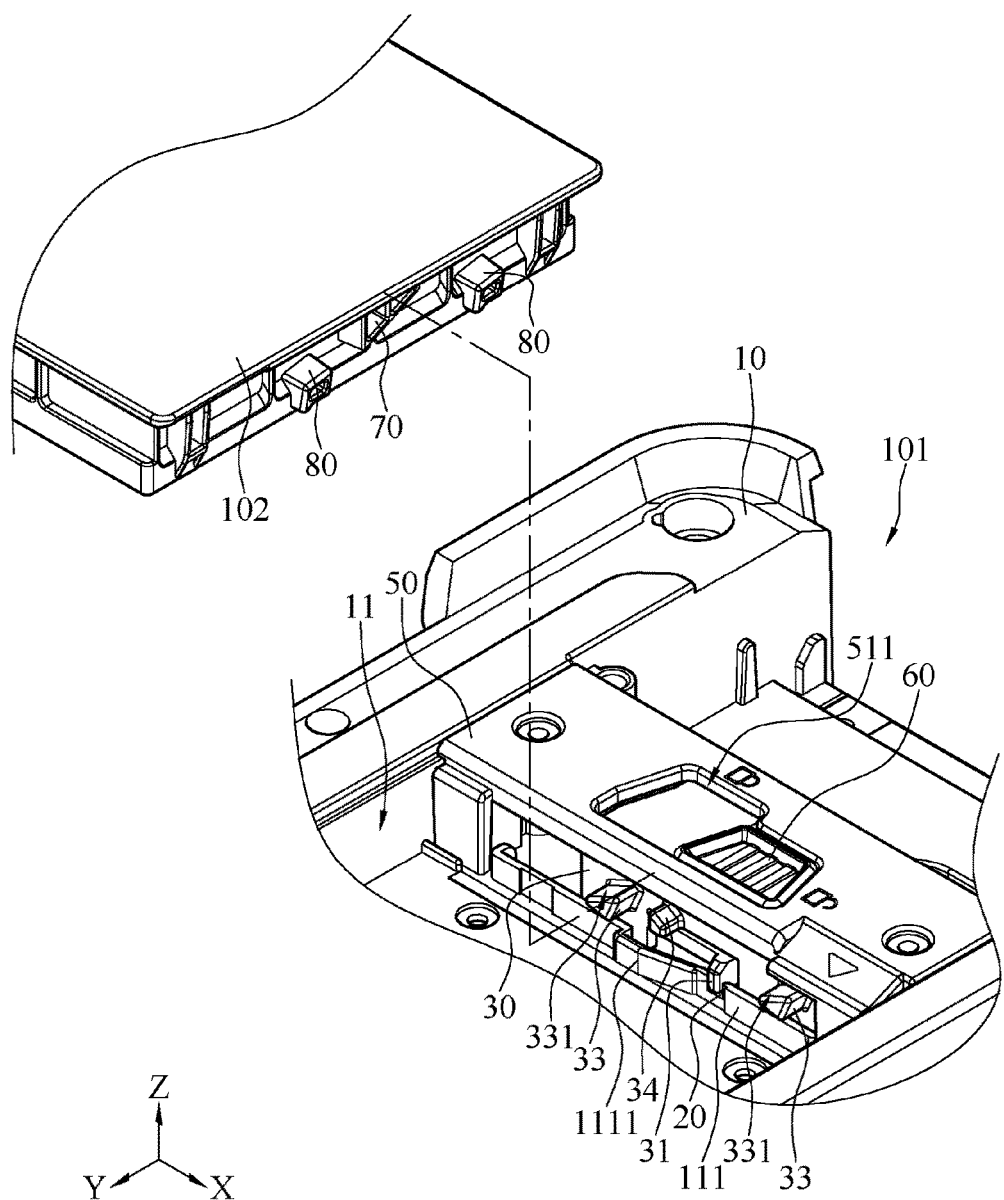
FIG. 2 is an exploded view of the electronic device according to the first embodiment of the present invention.
Figure 3:
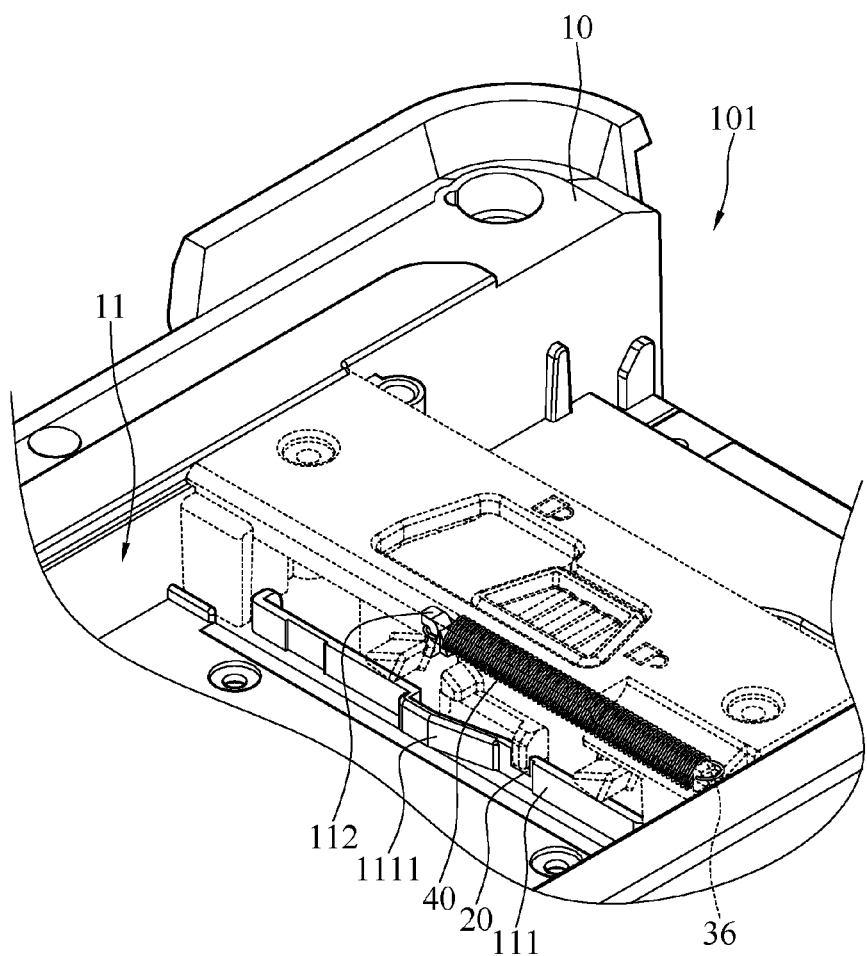
FIG. 3 is a partial cutaway enlarged view of an assembly structure according to the first embodiment of the present invention.
Figure 4:
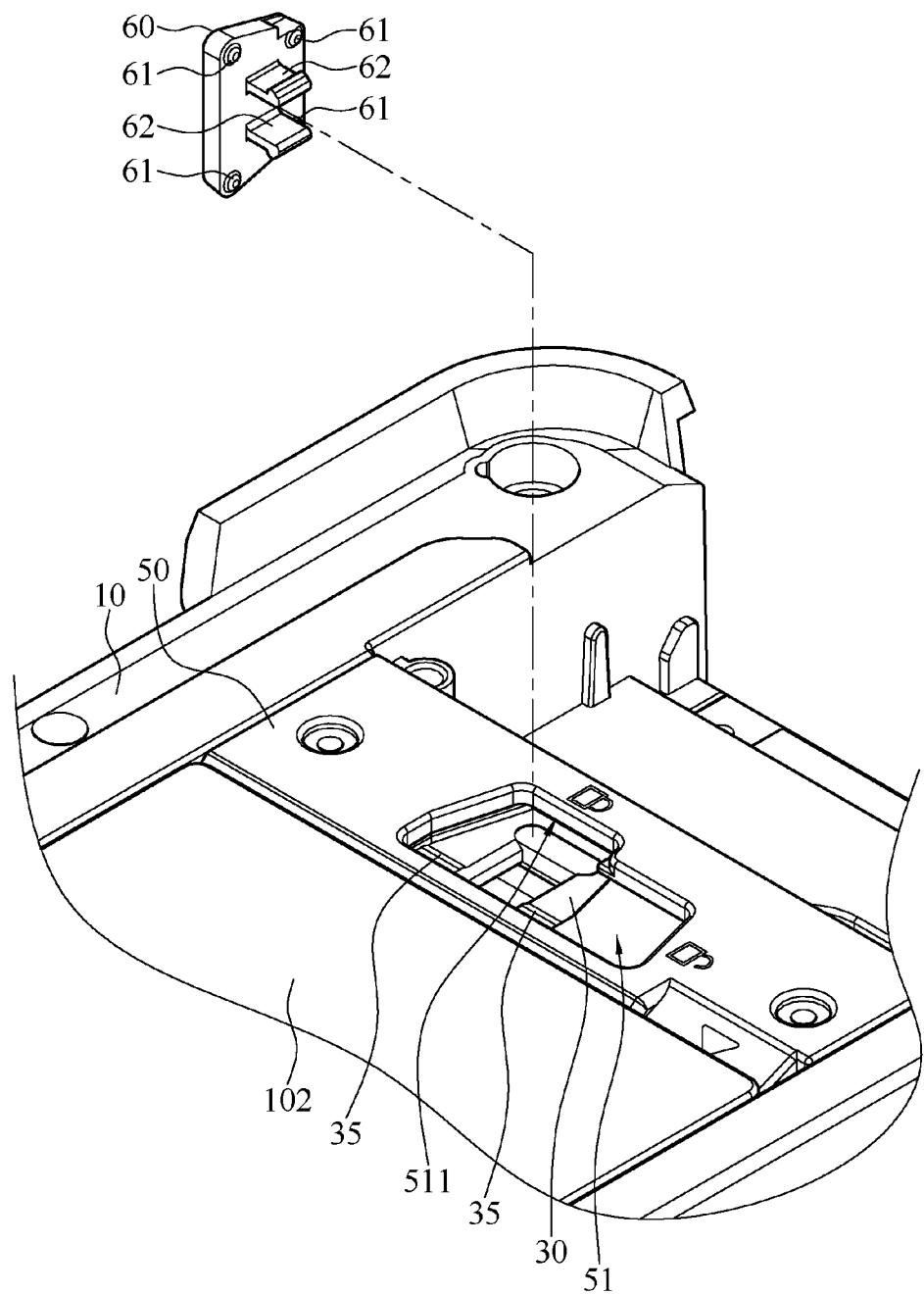
FIG. 4 is a partial enlarged view of the electronic device according to the first embodiment of the present invention.
Figure 5:
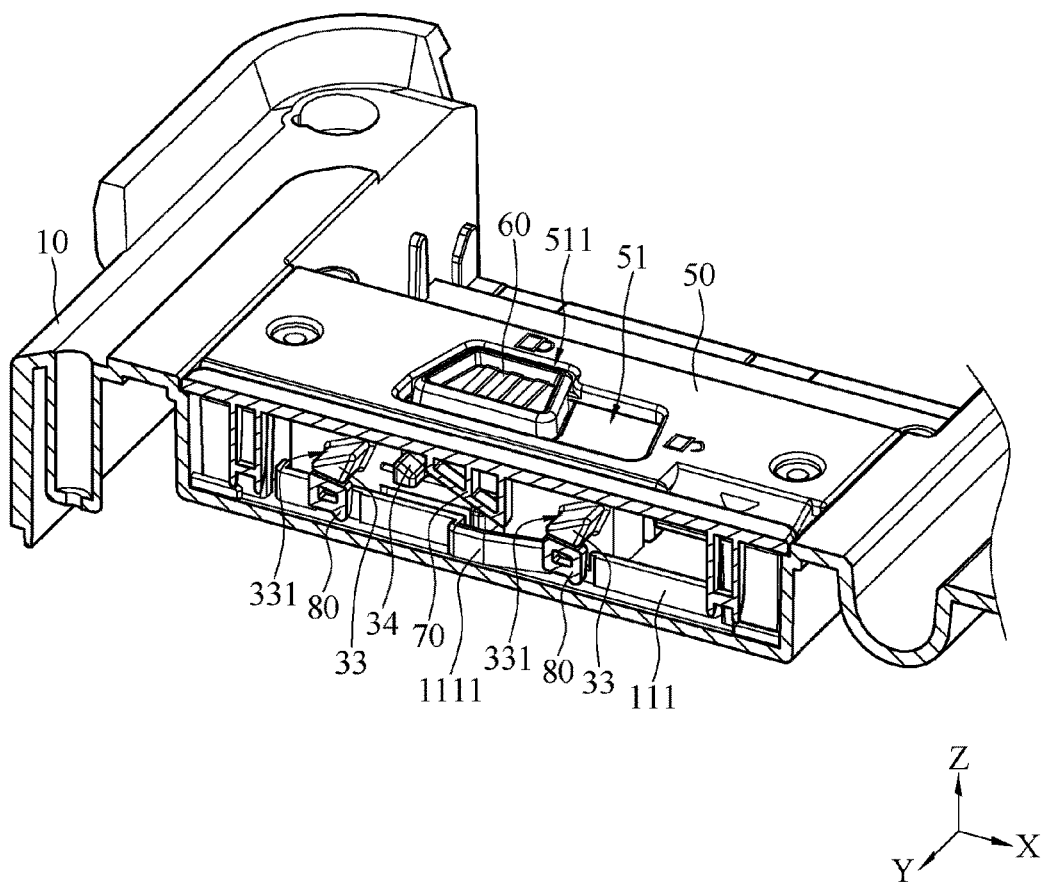
FIG. 5 is a cross-sectional schematic view of a fixing element which has moved to a locked position according to the first embodiment of the present invention.

Referring to FIG. 1 through FIG. 5, there are shown in FIG. 1 a schematic view of assembly of an electronic device according to the first embodiment of the present invention, in FIG. 2 an exploded view of the electronic device according to the first embodiment of the present invention, in FIG. 3 a partial cutaway enlarged view of an assembly structure according to the first embodiment of the present invention, in FIG. 4 a partial enlarged view of the electronic device according to the first embodiment of the present invention, and in FIG. 5 a cross-sectional schematic view of a fixing element which has moved to a locked position according to the first embodiment of the present invention. In the aforesaid embodiments, an electronic device 100 comprises a case 101 and a battery pack 102. Referring to FIG. 1, the battery pack 102 is mounted on the case 101 to supply power to the electronic device 100 and thus render it portable. In this embodiment, the case 101 may be equipped with two battery packs 102. In a variant embodiment, the case 101 is equipped with one, two or more battery packs 102, but the present invention is not limited thereto.

To illustrate directions of movement of related components according to the present invention, FIG. 2 depicts a coordinate system defined by X-axis, Y-axis, and Z-axis which extend in the first direction, the second direction perpendicular to the first direction, and the third direction perpendicular to the first and second directions, respectively. Referring to FIG. 2 and FIG. 3, the case 101 with an assembly structure comprises a body 10, an engaging portion 20, a fixing element 30, and an elastic component 40. In this embodiment, two identical battery packs 102 are mounted on the case 101 and associated with the same assembly structure; hence, only one of the two battery packs 102 and the corresponding assembly structure are described hereunder for illustrative sake.

The body 10 has a receiving slot 11 for receiving the battery pack 102. The engaging portion 20 is disposed in the receiving slot 11. In this embodiment, the engaging portion 20 is a groove disposed on a blocking wall 111 which is formed and raised in the receiving slot 11. The fixing element 30 is disposed on the body 10 slidably, beside the receiving slot 11, and proximate to the engaging portion 20. Referring to FIG. 2, the fixing element 30 is disposed between the short side of the receiving slot 11 and the blocking wall 111 and slides along X-axis. The fixing element 30 comprises a hook 31. The hook 31 of the fixing element 30 is engaged with the engaging portion 20 to allow the fixing element 30 to be fixed at a released position. Alternatively, the hook 31 of the fixing element 30 is separated from the engaging portion 20 to allow the fixing element 30 to move to the locked position. Its operation is described later.

Referring to FIG. 3, the elastic component 40 has one end disposed at the body 10 and the other end disposed at the fixing element 30. Likewise, the elastic component 40 is received in the receiving slot 11 and inside the fixing element 30, as shown in FIG. 3. In this embodiment, the elastic component 40 is a spring with one end fixed to a first hook 112 protruding from the receiving slot 11 and the other end fixed to a second hook 36 protrudingly disposed at the fixing element 30.

Referring to FIG. 2 through FIG. 5, in this embodiment, the fixing element 30 moves along X-axis (the first direction) to reach the locked position and the released position. The battery pack 102 received in the receiving slot 11 is blocked and fixed in place and thus cannot loosen as soon as the fixing element 30 moves to the locked position. The battery pack 102 can be demounted and removed from the receiving slot 11 as soon as the fixing element 30 moves to the released position.

Referring to FIG. 2, if the fixing element 30 moves to the released position, the hook 31 of the fixing element 30 moves along Y-axis (the second direction) to become engaged with the engaging portion 20. Referring to FIG. 2, in this embodiment, a rail 1111 is concavely disposed on the blocking wall 111. A ramp is disposed on the sidewall of the rail 1111. The ramp extends forward along X-axis and tilts backward along Y-axis. When the fixing element 30 is located at the locked position shown in FIG. 5, the hook 31 of the fixing element 30 fits inside the rail 1111. When the fixing element 30 moves forward along X-axis, the hook 31 moves backward along Y-axis, because the hook 31 is pushed by the sidewall of the rail 1111 which tapers. It is only when the hook 31 moves and reaches the engaging portion 20 located at the terminal end of the rail 1111 that the hook 31 springs forward along Y-axis under an acting force exerted by an elastic arm and thus becomes fixed to the engaging portion 20.

When the fixing element 30 is located at the released position, the elastic component 40 drives the fixing element 30 toward the locked position. In this embodiment, the elastic component 40 is a spring and is exemplified by a tension spring. When the fixing element 30 moves to the released position, the elastic component 40 is stretched forward along X-axis to generate a restoring force. Since one end of the elastic component 40 is fixed to the fixing element 30, the fixing element 30 moves backward along X-axis under the restoring force of the elastic component 40.

When the battery pack 102 is unlocked in order to be removed or is not mounted on the case 101, the fixing element 30 is moved to the released position and fixed at the released position without any chance of going back to the locked position. Therefore, a user can demount the battery pack 102 without pushing the fixing element 30 continuously.

Referring to FIG. 2 through FIG. 5, when the battery pack 102 is received in the receiving slot 11, the hook 31 of the fixing element 30 is pushed by the battery pack 102 and thus separated from the engaging portion 20. At this point in time, under the restoring force exerted by the elastic component 40, the fixing element 30 moves backward along X-axis and reaches the locked position so that the fixing element 30 fixes the battery pack 102 in place, thereby allowing the battery pack 102 to be fixed in place without any chance of loosening while in use or in motion. Therefore, the user need not pull the fixing element 30 by hand in order to move it to the locked position. Accordingly, the situation where the user forgets to fasten the battery pack 102 after mounting the battery pack 102 in place and in consequence the battery pack 102 loosens, falls off and gets damaged is impossible to occur.

Referring to FIG. 2 and FIG. 5, in this embodiment, the case 101 further comprises a lid 50 and an operating element 60. The lid 50 is fastened to the body 10 to cover the fixing element 30. The lid 50 has a guide hole 51. The operating element 60 is mounted on the fixing element 30 and slides within the guide hole 51. Referring to FIG. 5, the operating element 60 has two hook portions 62 whereby the operating element 60 is mounted on and fixed to the fixing element 30 so that the user can move the fixing element 30 from the locked position to the released position easily. The purpose of the guide hole 51 is to restrict the slide of the operating element 60 to between the locked position and the released position and thus restrict the movement of the fixing element 30, which the operating element 60 is fixed to, to between the two positions.

To preclude the situation where the user carrying or operating the electronic device 100 inadvertently triggers the operating element 60 to move to the released position after the fixing element 30 has slid and moved to the locked position under the acting force exerted by the elastic component 40, the guide hole 51 has a positioning portion 511, and the operating element 60 slides and moves along Y-axis to reach the positioning portion 511. The positioning portion 511 corresponds in shape to the operating element 60. After the operating element 60 has been pushed and moved to the positioning portion 511, the positioning portion 511 prevents the operating element 60 from moving along X-axis.

Referring to FIG. 5, in this embodiment, the operating element 60 further comprises four raised portions 61, and the fixing element 30 further comprises two raised tracks 35. In this regard, the aforesaid quantity of the raised portions 61 and raised tracks 35 merely serves an exemplary purpose and thus is subject to changes as needed. The four raised portions 61 are disposed on the operating element 60 and face the fixing element 30. To afford possibility for the operating element 60 to move across a plane, the raised portions 61 are disposed at the four corners of the operating element 60, respectively. The raised portions 61 located on the long side of the operating element 60 slide and move backward along Y-axis to reach the side of the raised tracks 35 as soon as the operating element 60 is pushed and moved to the positioning portion 511. Moving the raised portions 61 past the raised tracks 35 gives the user a sense of operating the operating element 60 and thus assures the user that the operating element 60 has been positioned in place. Furthermore, the raised tracks 35 serve a positioning purpose to prevent the operating element 60 from moving slidingly out of the positioning portion 511.

Referring to FIG. 2 and FIG. 5, in this embodiment, in addition to the hook 31, the fixing element 30 comprises a protruding element 34. The protruding element 34 is adjacent to the hook 31. The battery pack 102 comprises a pushing element 70. Referring to FIG. 2 and FIG. 5, the protruding element 34 of the fixing element 30 is disposed above the hook 31, as shown in FIG. 2. When the fixing element 30 is located at the released position shown in FIG. 2, insertion of the battery pack 102 into the receiving slot 11 drives the pushing element 70 of the battery pack 102 to the protruding element 34, thereby separating the hook 31 from the engaging portion 20. Upon the separation of the hook 31 from the engaging portion 20, the fixing element 30 moves toward the locked position under the restoring force of the elastic component 40.

The fixing element 30 further comprises two positioning elements 33. The two positioning elements 33 protrude along Y-axis and toward the battery pack 102. The battery pack 102 further comprises two blocking elements 80. In this regard, the quantity of the positioning elements 33 and blocking elements 80 merely serves an exemplary purpose and thus is subject to changes as needed. In a variant embodiment, the positioning elements 33 and the blocking elements 80 are each in the number of one, two or more. Referring to FIG. 5, when the fixing element 30 moves to the locked position and the battery pack 102 is received in the receiving slot 11, the positioning elements 33 block the blocking elements 80, respectively. In this embodiment, the positioning elements 33 correspond in quantity to the blocking elements 80, and the positioning elements 33 block the blocking elements 80, respectively.

Referring to FIG. 2 and FIG. 5, when the fixing element 30 is located at the released position, the positioning elements 33 are aligned forward along X-axis. At this point in time, insertion of the battery pack 102 into the receiving slot 11 causes the blocking elements 80 to move downward smoothly without being blocked by the positioning elements 33. After the battery pack 102 has been received in the receiving slot 11, the fixing element 30 moves backward along X-axis under the acting force of the elastic component 40 to reach the locked position, and thus the positioning elements 33 are above the blocking elements 80. The insertion of the battery pack 102 into the receiving slot 11 and movement of the fixing element 30 to the locked position enable the positioning elements 33 to block the battery pack 102, thereby preventing the battery pack 102 from loosening.

Referring to FIG. 2, the positioning elements 33 each comprise a ramp 331. In this embodiment, the ramps 331 each extend forward along X-axis and tilt forward along Z-axis. If the fixing element 30 is not fixed to the released position, it is not necessary to move the fixing element 30 to the released position beforehand in order to mount the battery pack 102 on the case 101. What the user needs to do is to press the battery pack 102 into the receiving slot 11 and allow the blocking elements 80 to push the fixing element 30 along the ramps 331 so that the fixing element 30 moves toward the released position, thereby allowing the battery pack 102 to be received in the receiving slot 11. After the battery pack 102 has been mounted on the case 101, the fixing element 30 moves to the locked position under the restoring force of the elastic component 40. Therefore, the process performed by the user to mount and fasten the battery pack 102 to the case 101 according to the present invention is simpler than its conventional counterpart.

Although the present invention is disclosed above by preferred embodiments, the preferred embodiments are not restrictive of the present invention. Changes and modifications made by persons skilled in the art to the preferred embodiments without departing from the spirit and scope of the present invention must be deemed falling within the scope of the present invention. Accordingly, the legal protection for the present invention should be defined by the appended claims.

What is claimed is:

1. A case with an assembly structure, comprising:
a body having a receiving slot;
an engaging portion disposed in the receiving slot;
a fixing element disposed on the body, beside the receiving slot, and proximate to the engaging portion, the fixing element comprising a hook, and the fixing element being slidable along an axis between a released position and a locked position; and
an elastic component with an end disposed at the body and another end disposed at the fixing element, arranged such that when the fixing element is moved along the axis from the locked position to the released position, the elastic component generates a restoring force to drive the fixing element back along the axis to the locked position, and
wherein when the fixing element is moved from the locked position to the released position, the hook of the fixing element becomes engaged with the engaging portion so as to hold the fixing element in the released position against the restoring force of the elastic component.

2. The case with an assembly structure according to claim 1, further comprising a lid and an operating element, the lid being fastened to the body and having a guide hole, and the operating element being mounted on the fixing element and sliding within the guide hole.

3. The case with an assembly structure according to claim 2, wherein the guide hole has a positioning portion, and the operating element slides and moves in the second direction to reach the positioning portion.

4. The case with an assembly structure according to claim 2, wherein the operating element comprises at least one raised portion, and the fixing element further comprises at least one raised track, allowing the at least one raised portion to slide and move in the second direction to any one side of the at least one raised track selectively.

5. The case with an assembly structure according to claim 1, wherein the fixing element further comprises at least one positioning element protruding in the second direction.

6. The case with an assembly structure according to claim 5, wherein the at least one positioning element comprises a ramp.

7. An electronic device, comprising:
a case comprising:
a body having a receiving slot;
an engaging portion disposed in the receiving slot;
a fixing element disposed on the body, beside the receiving slot, and proximate to the engaging portion, the fixing element comprising a hook and a protruding element, and the fixing element being slidable along an axis between a released position and a locked position; and
an elastic component with an end disposed at the body and another end disposed at the fixing element, arranged such that when the fixing element is moved along the axis from the locked position to the released position, the elastic component generates a restoring force to drive the fixing element back along the axis to the locked position; and
a battery pack comprising a pushing element,
wherein when the fixing element is moved from the locked position to the released position, the hook of the fixing element becomes engaged with the engaging portion so as to hold the fixing element in the released position against the restoring force of the elastic component, and
when the fixing element is in the released position and the battery pack is inserted into the receiving slot, the pushing element pushes the protruding element so that the hook separates from the engaging portion, and the restoring force of the elastic component causes the fixing element to move to the locked position.

8. The electronic device according to claim 7, wherein the fixing element further comprises at least one positioning element protruding in the second direction, and the battery pack further comprises at least one blocking element, thereby allowing the at least one positioning element to block the at least one blocking element as a result of movement of the fixing element to the locked position and insertion of the battery pack into the receiving slot.

9. The electronic device according to claim 8, wherein the at least one positioning element comprises a ramp.

10. The electronic device according to claim 7, further comprising a lid and an operating element, the lid being fastened to the body and having a guide hole, and the operating element being mounted on the fixing element and sliding within the guide hole.

11. The electronic device according to claim 10, wherein the guide hole has a positioning portion, and the operating element slides and moves in the second direction to reach the positioning portion.

12. The electronic device according to claim 10, wherein the operating element comprises at least one raised portion, and the fixing element further comprises at least one raised track, allowing the at least one raised portion to slide and move in the second direction to any one side of the at least one raised track selectively.

13. The case with an assembly structure according to claim 1, wherein when the fixing element is moved from the locked position to the released position, the hook of the fixing element moves in a direction perpendicular to the axis to become engaged with the engaging portion.

14. The case with an assembly structure according to claim 7, wherein when the fixing element is moved from the locked position to the released position, the hook of the fixing element moves in a direction perpendicular to the axis to become engaged with the engaging portion.

* * * * *